United States Patent
Muendel et al.

(10) Patent No.: US 8,879,589 B2
(45) Date of Patent: Nov. 4, 2014

(54) STABILIZING BEAM POINTING OF A FREQUENCY-CONVERTED LASER SYSTEM

(71) Applicant: JDS Uniphase Corporation, Milpitas, CA (US)

(72) Inventors: Martin H. Muendel, Oakland, CA (US); Loren Eyres, Palo Alto, CA (US)

(73) Assignee: JDS Uniphase Corporation, Milpitas, CA (US)

( * ) Notice: Subject to any disclaimer, the term of this patent is extended or adjusted under 35 U.S.C. 154(b) by 0 days.

(21) Appl. No.: 13/847,405

(22) Filed: Mar. 19, 2013

(65) Prior Publication Data

US 2013/0250979 A1 Sep. 26, 2013

Related U.S. Application Data

(60) Provisional application No. 61/613,371, filed on Mar. 20, 2012.

(51) Int. Cl.
| | | |
|---|---|---|
| *H01S 3/10* | (2006.01) | |
| *G02F 1/35* | (2006.01) | |
| *H01S 5/06* | (2006.01) | |
| *H01S 5/062* | (2006.01) | |
| *H01S 5/068* | (2006.01) | |
| *H01S 5/00* | (2006.01) | |
| *H01S 5/024* | (2006.01) | |
| *H01S 3/067* | (2006.01) | |
| *H01S 3/16* | (2006.01) | |
| *H01S 5/12* | (2006.01) | |
| *H01S 5/40* | (2006.01) | |

(52) U.S. Cl.
CPC ......... *H01S 5/06821* (2013.01); *H01S 5/02446* (2013.01); *G02F 1/353* (2013.01); *H01S 3/06754* (2013.01); *H01S 5/0604* (2013.01); *H01S 3/1618* (2013.01); *G02F 2203/60* (2013.01); *G02F 1/3544* (2013.01); *H01S 5/12* (2013.01); *H01S 5/0622* (2013.01); *H01S 5/0092* (2013.01); *H01S 5/4006* (2013.01); *H01S 5/0612* (2013.01); *H01S 5/06216* (2013.01)
USPC .................. 372/20; 372/21; 372/22; 372/26; 372/29.023; 372/29.02

(58) Field of Classification Search
USPC .................. 372/20, 21, 22, 26, 29.023, 29.02
See application file for complete search history.

(56) References Cited

U.S. PATENT DOCUMENTS

| | | | | |
|---|---|---|---|---|
| 3,962,576 | A | 6/1976 | Kuhl et al. | 250/201.9 |
| 5,297,156 | A * | 3/1994 | Deacon | 372/21 |
| 5,373,515 | A * | 12/1994 | Wakabayashi et al. | 372/20 |
| 6,614,584 | B1 * | 9/2003 | Govorkov et al. | 359/328 |
| 7,242,700 | B2 * | 7/2007 | Wang | 372/22 |
| 7,576,867 | B2 | 8/2009 | Gollier | 356/480 |
| 7,633,979 | B2 | 12/2009 | Luo et al. | 372/21 |
| 7,885,311 | B2 | 2/2011 | Cho et al. | 372/71 |

* cited by examiner

Primary Examiner — Kinam Park
(74) Attorney, Agent, or Firm — JDS Uniphase Corporation (57) ABSTRACT

A beam-stabilized laser system using optical frequency conversion in a nonlinear optical crystal is disclosed. An optimal phase-matching angle in the crystal depends on both wavelength and temperature. If the crystal temperature changes, the optimal phase-matching direction will change as well. A different wavelength can be selected so that the optimal phase-matching occurs along the original beam path and returns the output beam to the original direction. Thus, a central wavelength of the laser beam illuminating the nonlinear optical crystal can be slightly adjusted to compensate for the pointing drift. Since the illuminating wavelength can normally be tuned much faster than the crystal temperature, a more agile and responsive pointing stabilization can be achieved.

20 Claims, 3 Drawing Sheets

STABILIZING BEAM POINTING OF A FREQUENCY-CONVERTED LASER SYSTEM

RELATED APPLICATION DATA

This application claims priority to U.S. Provisional Patent Application No. 61/613,371, filed Mar. 20, 2012, the entirety of which is hereby incorporated by reference.

TECHNICAL FIELD

The present invention relates to laser systems, and in particular to devices and methods for stabilizing of beam pointing of frequency-converted laser systems.

BACKGROUND OF THE INVENTION

Optical frequency conversion, such as second harmonic generation (SHG), third harmonic generation (THG), or sum or differential frequency generation, is employed in laser systems to generate coherent beams of light at a variety of wavelengths ranging from infrared to ultraviolet. A frequency-converted laser system has a laser oscillator coupled to a frequency converting nonlinear optical crystal. An amplifier may also be coupled between the oscillator and frequency converting crystal. The laser oscillator is often operated in a pulsed regime to attain the high peak intensity levels required for efficient nonlinear optical conversion. A monochromatic laser beam, called a "fundamental" beam, is focused into one or more nonlinear optical crystals, where the frequency conversion takes place, to generate a "harmonic" beam, for example a second harmonic or a third harmonic optical beam.

When nonlinear optical frequency conversion of a laser beam to the ultraviolet or other short wavelengths is performed in a crystal, any optical absorption can result in heat deposition within the crystal. This deposited heat can lead to an increase of the crystal temperature. The degree of temperature increase depends on the optical absorption level and amount of optical power transmitted or generated in the crystal. If large enough, the temperature rise in the crystal can cause changes in the optimal phase matching angle within the crystal and, in turn, cause changes to the beam position, beam pointing, or the conversion efficiency, depending on the exact configuration.

In particular, in the case of relatively tight focusing within the crystal to achieve high conversion efficiency, a crystal temperature change will cause a change in the angular pointing direction of the harmonic beam out of the crystal. This pointing change occurs in a phase-matching plane. Since the pointing direction depends on the amount of absorbed optical power, any changes in the input or output optical power can cause pointing changes. Thus, the beam pointing will change as the optical power levels are increased or decreased, which is very undesirable in an end application, such as laser machining. Similarly, if the optical power level is modulated on and off, the beam pointing direction will depend on the present modulation state and the recent thermal history of the nonlinear crystals.

Kuhl et al. in U.S. Pat. No. 3,962,576 disclose a frequency-converted laser system using SHG, in which nonlinear optical crystal temperature and/or orientation is adjusted to keep the SHG efficiency high. To that end, a pair of photoelectric detectors is used to determine a change of a relative position of fundamental and second harmonic optical beams. When a change of the relative position is detected, a feedback circuit causes the nonlinear optical crystal to be rotated, or its temperature changed, so as to counteract the detected change of the relative position of the beams. This improves stability of SHG efficiency.

Govorkov et al. in U.S. Pat. No. 6,614,584 disclose a system operating similarly to that of Kuhl et al. In the Govorkov system, separate position sensitive detectors (PSD) are used to track the locations of the fundamental and harmonic beams. The nonlinear optical crystal orientation and/or temperature are adjusted to keep the relative position of the beams constant, which results in keeping an optimal phase matching condition in the crystal.

Adjusting orientation of nonlinear optical crystals is associated with a fundamental drawback, namely it can cause a displacement of the frequency-converted laser beam. In many applications, laser beam positioning and pointing need to be stable with time. Whether a frequency-converted laser beam is coupled into an optical delivery fiber or is reflected towards a target in free space, an unstable or wandering laser beam can cause imperfect or fluctuating illumination of a target, or can even cause a catastrophic failure of a laser beam delivery system.

Wang in U.S. Pat. No. 7,242,700 discloses a frequency-converted laser system, in which a power and a position of a frequency-converted laser beam are monitored. The temperature of the nonlinear optical crystal is adjusted to maintain the frequency-converted beam at a pre-determined position. The optical pump power is adjusted to maintain the power of the frequency-converted beam at a predetermined level. Thus, the crystal temperature adjustment serves to stabilize the pointing, whereas the pump power is adjusted to stabilize the output optical power.

One drawback of stabilization of the output beam pointing by tuning the crystal temperature is a relatively slow response time. An oven or thermostat holding a SHG or a THG crystal is typically designed with a significant thermal mass to ensure that the crystal is held at a uniform temperature over its entire length. Changing the temperature of the oven and the crystal can take from tens of seconds to a minute. When the optical power is changed, one must wait this long before a thermal drift of beam pointing can be fully compensated. This reduces the utility of the laser system, particularly if rapid changes between power levels, or a gated operation regime is desired.

SUMMARY OF THE INVENTION

It is a goal of the invention to provide a system and a method for a rapid stabilization of beam pointing in a frequency-converted laser system.

An optimal phase-matching angle in a nonlinear optical crystal depends upon both wavelength and temperature. If the temperature of the crystal increases and the optimal phase-matching direction tilts upward for the original input wavelength, a different wavelength can be selected so that the optimal phase-matching occurs along the original beam path; this returns the output beam to the original direction. A central wavelength of the laser beam illuminating the nonlinear optical crystal can be adjusted slightly to compensate for the pointing drift. Since the illuminating wavelength can in some configurations be tuned more rapidly than the nonlinear optical crystal temperature, a more agile and responsive pointing stabilization can be achieved.

By way of a non-limiting example, for third harmonic generation of 355 nm in lithium triborate (LBO) from a 1064 nm and 532 nm input, the angular tuning rate of the optimal phase matching direction is 0.99 mrad/° C. For a 5° C. increase in crystal temperature, which is exaggerated in this example, the Type II optimal phase matching angle for $3^{rd}$ harmonic generation of 1064 nm in the LBO relative to the crystalline Z-axis changes from 42.8 degrees to 43.1 degrees. If the wavelength is simultaneously shifted by approximately 1.4 nm to 1065.4 nm, the optimal phase-matching angle returns to 42.8 degrees at the higher temperature. Of course, there are applications which cannot handle the shift in wavelength that this approach uses to achieve the pointing compensation, but there are many applications where a slight wavelength change in the 0.01% to 0.5% range is acceptable.

In accordance with the invention, there is provided a laser system comprising:

a laser oscillator for providing a first optical beam at a first optical frequency;
  a frequency converting element coupled to the laser oscillator, for converting the first optical beam into a second optical beam at a second optical frequency different from the first optical frequency, wherein a pointing angle of the second optical beam is dependent on the first optical frequency;
  a beamsplitter coupled to the frequency converting element, for splitting a portion of the second optical beam;
  a position-sensitive detector coupled to the beamsplitter, for receiving the portion of the second optical beam for detecting a deviation of the pointing angle of the second optical beam; and
  a controller coupled to the position-sensitive detector and to the laser oscillator, configured for adjusting the first optical frequency of the laser oscillator so as to lessen the deviation of the pointing angle of the second optical beam.

In one embodiment, the laser oscillator includes a directly driven laser diode whose first optical frequency is adjusted by changing a time-averaged injection current into the laser diode, thereby changing its temperature. The current injection can be in the form of a DC bias current or of pulses of driving current of varying duration. However, changing the DC bias current or modulating the pulsewidth may cause power and pulsewidth changes undesirable in the final application. To prevent the optical power and/or pulsewidth of the output laser beam from varying concurrently with changes to the injection current, an optical modulator means, for example a pulsed semiconductor optical amplifier (SOA), can be used in conjunction with the laser diode to define the amplitude and desired temporal profile of the output light pulses. In this case the output of the directly driven laser diode is coupled into the SOA and provides a seed signal for amplification within the SOA. The pulsed driving current of the SOA has a train of pulses of a constant duration, defining the output pulsewidth. To provide a steady and uninterrupted train of optical pulses, the pulses driving the semiconductor optical amplifier are synchronized with the pulses of the current driving the laser diode, so that the seed signal from the laser diode is present whenever the SOA drive pulse is applied. Provided that the SOA is operated in a well-saturated input regime, the output amplitude and pulsewidth of the pulses from the SOA will be only weakly dependent on the input amplitude from the laser diode. The output pulses from the SOA will then exhibit amplitude and temporal stability despite the changes in wavelength and input power from the directly driven laser diode.

In accordance with another aspect of the invention, there is further provided a method for lessening a drift of a pointing angle of an above described laser system, the method comprising:

(a) directing the portion of the second optical beam to the position-sensitive detector;
  (b) detecting the deviation of the pointing angle of the second optical beam using the position-sensitive detector; and
  (c) adjusting, via the controller, the first optical frequency of the laser oscillator, so as to lessen the deviation of the pointing angle of the second optical beam.

BRIEF DESCRIPTION OF THE DRAWINGS

Exemplary embodiments will now be described in conjunction with the drawings, in which.

DETAILED DESCRIPTION OF THE INVENTION

While the present teachings are described in conjunction with various embodiments and examples, it is not intended that the present teachings be limited to such embodiments. On the contrary, the present teachings encompass various alternatives, modifications and equivalents, as will be appreciated by those of skill in the art.

Figure 1:
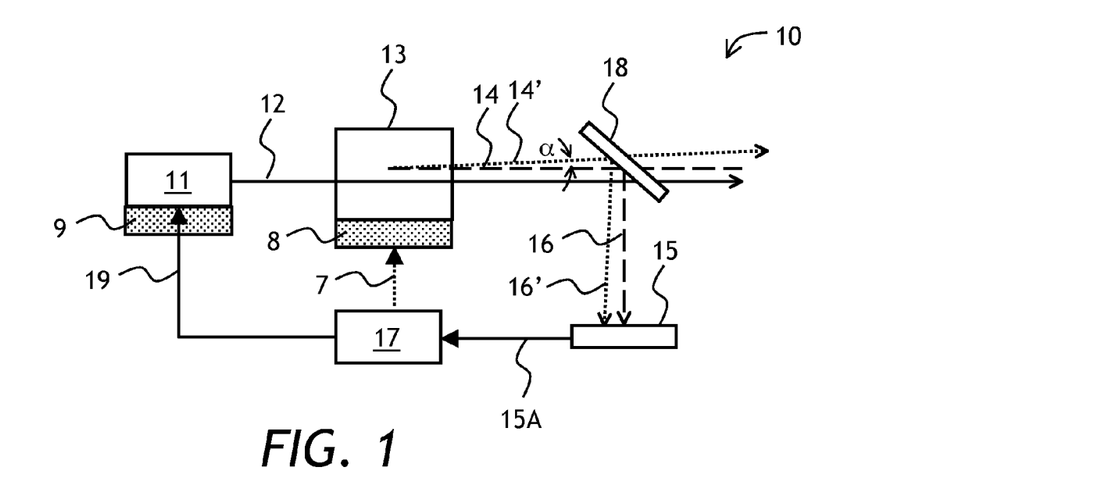
FIG. 1 is a block diagram of a frequency-converted laser system of the invention.

Referring to FIG. 1, a laser system 10 includes a laser oscillator 11 for providing a first optical beam 12 at a first optical frequency, a frequency converting element 13 coupled to the laser oscillator 11, for converting the first optical beam 12 into a second optical beam 14 at a second optical frequency, different from the first optical frequency. A beamsplitter 18 is coupled to the frequency converting element 13 for splitting a portion 16 of the second optical beam 14. A position-sensitive detector (PSD) 15 is coupled to the beamsplitter 18, and is disposed to receive the portion 16 of the second optical beam 14. A controller 17 is coupled to the PSD 15 and to the laser oscillator 11. The laser oscillator 11 and the frequency converting element 13 can be thermally coupled to thermoelectric coolers (TEC) 9 and 8, respectively.

When the second optical beam 14 deviates from its original pointing angle due to a change of local temperature, thermal drifts, etc., the laser system 10 returns the second optical beam 14 to its original pointing angle. For example, when the second optical beam 14 tilts upwards by a pointing deviation angle α as shown by a deviated beam 14', the PSD 15 detects a deviated split beam portion 16', and provides a beam position signal 15A to the controller 17. The controller 17 provides a control signal 19 to adjust the first frequency of the laser oscillator 11, so as to lessen the deviation α of the pointing angle of the second optical beam 14', bringing it back to the original position of the second optical beam 14.

The lasing optical frequency, that is, the first frequency of laser oscillator 11, can be tuned in a variety of ways, depending on the type of the laser oscillator 11. For example, for external feedback tunable laser oscillators 11, an external wavelength selective element, such an external diffraction grating, may be tuned by using a bulk or a micro-electromechanical (MEMS) actuator. For distributed feedback (DFB)

or distributed Bragg reflector (DBR) laser diode oscillators 11, the output wavelength or optical frequency typically depends on temperature through the temperature dependence of refractive index and the thermal expansion of the lasing cavity. As the temperature increases, the cavity expands, and the refractive index increases due to the red shift of the bandgap. Both of these effects cause the laser cavity mode to shift to longer wavelengths as the temperature is increased.

Temperature control of a single-frequency laser diode can be accomplished in different ways, but is typically done using a TEC. Frequently, packaged fiber-coupled laser diodes have a TEC integrated into the package. Such a TEC typically has a thermal time constant of ~1 second for changing the semiconductor device temperature, so that any pointing compensation would take roughly a second to return the output beam pointing to the original direction. Thus, for the DFB laser diode oscillator 11 temperature-controlled by the TEC 9, the control signal 19 can be a varying TEC current. In another embodiment, the laser diode oscillator 11 is controlled by applying a varying electrical current directly to the laser diode oscillator 11, thereby directly varying the temperature of the lasing p-n junction and, consequently, the optical cavity temperature of the laser diode oscillator 11. Function of the TEC 8 of the frequency converting element 13 will be considered further below.

Figure 2:
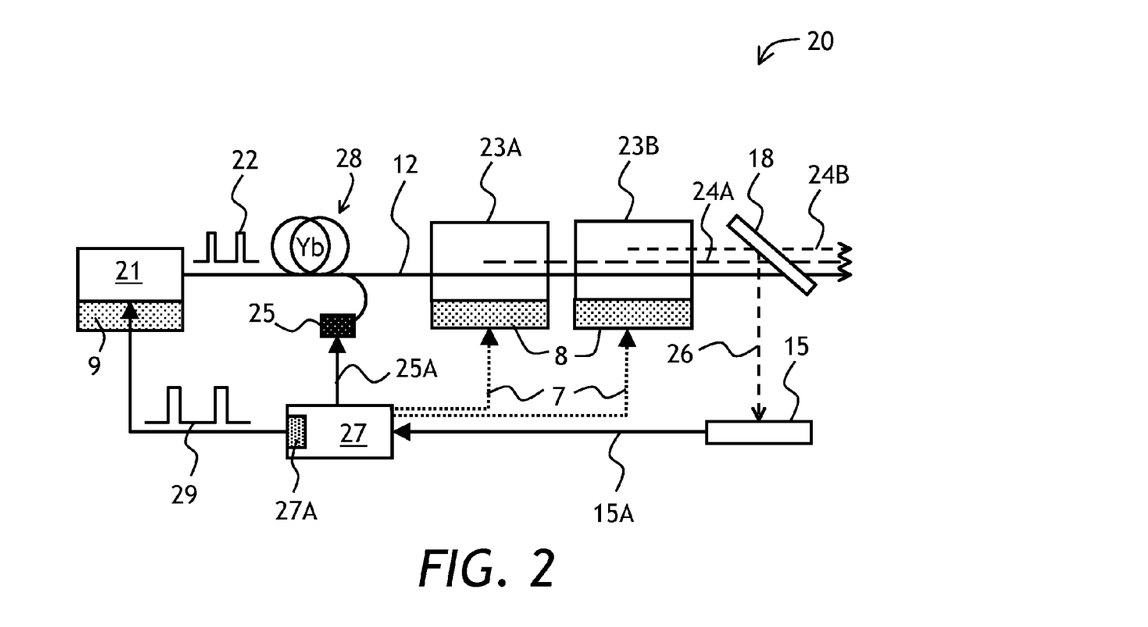
FIG. 2 is a block diagram of an embodiment of the system of FIG. 1 having a pulsed seed laser oscillator and an optical fiber amplifier.

Turning to FIG. 2 with further reference to FIG. 1, a laser system 20 of FIG. 2 is an embodiment of the laser system 10 of FIG. 1, with some elements added and some elements varied. The laser system 20 of FIG. 2 includes a DFB laser diode 21, which is a variant of the laser oscillator 11 of FIG. 1. The DFB laser diode 21 of FIG. 2 is fiber coupled to an Ytterbium (Yb) doped optical fiber amplifier 28 pumped by a pump diode 25. The Yb fiber amplifier 28 is coupled to SHG and THG crystals 23A and 23B, respectively, which correspond to the frequency converting element 13 of FIG. 1. In FIG. 2, a controller 27 is a variant of the controller 17 of the laser system 10 of FIG. 1. The controller 27 of FIG. 2 includes a laser diode driver 27A for driving the DFB laser diode 21 by electrical current pulses 29. The controller 27 also has a DC current source, not shown, for providing a DC current 25A for driving the pump diode 25 of the Yb fiber amplifier 28.

In operation, the electrical current pulses 29 cause the DFB laser diode 21 to emit seed pulses 22 at a fundamental frequency. The Yb fiber amplifier 28 amplifies the seed pulses 22 to a level sufficient for optical harmonics generation. Second 24A and third 24B harmonic light is generated in the SHG and THG crystals 23A and 23B, respectively. The beamsplitter 18 splits off a small, for example less than 5% of optical power, portion 26 of the third harmonic light 24B to impinge on the PSD 15. The beam position signal 15A is sent to the controller 27. When the beam portion 26 deviates from its nominal position, the controller 27 causes the laser diode driver 27A to change a duration and/or a DC offset of the electrical current pulses 29, thereby changing the temperature of the DFB laser diode 21, which causes the pointing angle of the third harmonic beam 24B to return to its original value.

One advantage of the seed (DFB laser diode 21)—amplifier (fiber amplifier 28) laser system 20 of FIG. 2 is that the seed laser diode (DFB laser diode 21) does not need to have a high average output optical power, and thus can be packaged in a small enclosure having a small thermal inertia, which allows the pointing compensation via the thermal control of the DFB laser 21 to be more agile. Heating can only move the wavelength or the optical frequency in one direction, typically longer wavelength for a semiconductor diode, but by proper biasing and/or by cooling of the DFB laser diode 21, one can achieve bidirectional wavelength control over the desired wavelength and pointing angle range. The output power of the third harmonic beam 24B can be optionally stabilized by adjusting the DC driving current 25A of the pump diode 25.

The SHG and THG crystals 23A and 23B are shown only as an example. Other types of nonlinear optical crystals 13 can of course be used, including sum and difference frequency generating crystals. One, two, or more sequentially disposed nonlinear optical crystals can be used. The stabilization can be via the third harmonic beam 24B as shown, or via the second harmonic beam 24A. Other types of fiber amplifiers, for example Erbium doped fiber amplifier, or non-fiber amplifiers can be used in place of the Yb doped optical fiber amplifier 28. Furthermore, a plurality of amplifiers, including multiple stages of amplification in different types and geometries of optical amplifiers, can be used to reach the desired output optical power. Other types of laser diodes such as a Distributed Bragg Reflector (DBR) can also be used in place of the DFB laser diode 21. The PSD 15 can include a split photodiode, a quad-cell photodiode, a linear array detector, or a 2D array detector.

The direct heating of the DFB laser diode 21 is effective in that the heat is applied directly to the lasing p-n junction of the DFB laser diode 21; however, the direct heating has some drawbacks. Adding an electrical current into the DFB laser diode 21, for example between the electrical current pulses 29 used for light generation, can change the temperature of the DFB laser diode 21. The accessible driving current range is limited by the need not to exceed the lasing threshold of the laser diode 21, because current injection above the threshold will result in additional optical radiation being injected into the Yb doped fiber amplifier 28 and a consequent reduction in the extractable power obtained from the Yb doped fiber amplifier 28 in the desired output light pulses 24A, 24B. Varying a duration or width of the electrical current pulses 29 can be used to vary the temperature of the DFB laser diode 21; however, this will vary the pulsewidth of the second harmonic 24A and the third harmonic 24B output optical pulses, which is undesirable. Furthermore, some of the types of the DFB laser diode 21 may require a particular CW bias current level for proper operation, which then removes the possibility of any adjustable heat delivery using the electrical current pulses 29.

Figure 3:
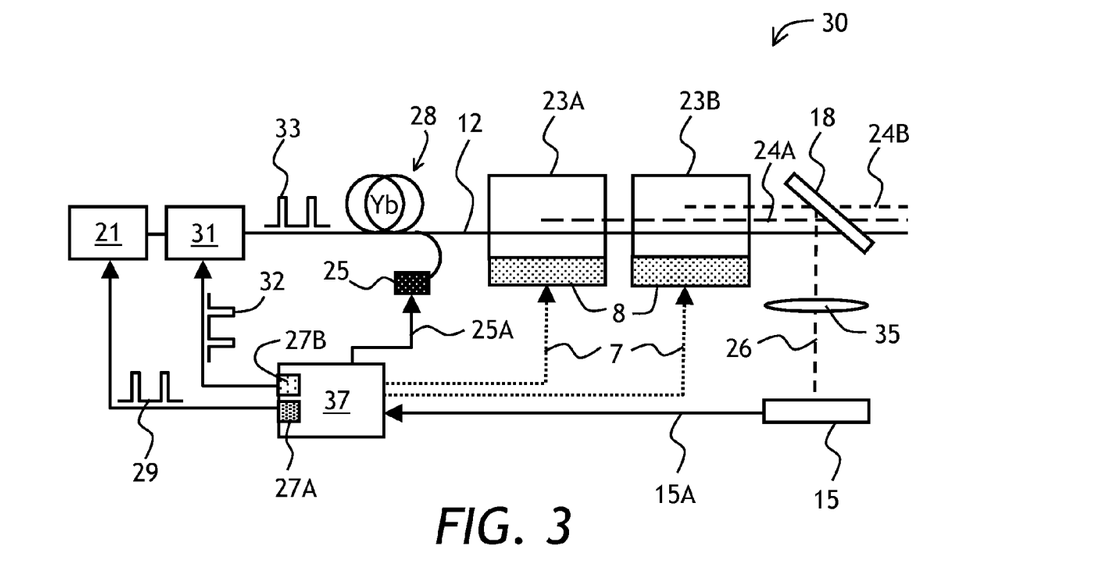
FIG. 3 is a block diagram of an embodiment of the system of FIG. 2 having a two-stage seed laser oscillator including a DFB laser diode and a pulsed semiconductor optical amplifier.

Moving to a two-stage seed architecture relaxes this constraint. Referring now to FIG. 3 with a further reference to FIG. 2, a laser system 30 of FIG. 3 is similar to the laser system 20 of FIG. 2, with some varied elements and some additional elements. In FIG. 3, a pulsed semiconductor optical amplifier (SOA) 31 is coupled between the DFB laser diode 21 and the Yb fiber amplifier 28. A controller 37 is a variant of the controller 27 of FIG. 2. The controller 37 of FIG. 3 includes the laser diode driver 27A and a SOA driver 27B. The SOA 31 is driven by electrical current pulses 32 generated by the SOA driver 27B. An optional angle-to-offset lens 35 is used to convert a beam angle of the reflected beam portion 26 into a beam offset. A concave mirror, or any other element having optical power, can be used in place of the angle-to-offset lens 35.

In this two-stage seed architecture, seed pulses 33 are generated by the first seed stage, that is, the DFB laser diode 21, which can operate either in pulsed mode or CW mode. The DFB laser diode 21 sets the wavelength/optical frequency of the system. After the first seed stage, the second seed stage, that is, the SOA 31, acts as a modulator and pulsed amplifier, reshaping the output of the DFB laser diode 21 to obtain the desired pulse temporal properties. The first seed stage could be any of the single-frequency semiconductor laser based devices described above. The second seed stage needs to have a high contrast ratio and can be a pulsed amplifier, such as the SOA 31, or alternatively an amplitude modulator such as an electro-optical or an acousto-optical modulator. The electro-optical modulator can be, for example, a lithium niobate (LiNbO$_3$) waveguide modulator.

If high contrast is achieved in the second seed stage, the constraints on injection current driven heating of the DFB laser diode 21 are relaxed. The DFB laser diode 21 can be operated at high average current to heat quickly and directly the DFB laser diode 21 and to shift the wavelength without generating significant additional seed pulses or changing the pulsewidth. By using the two-stage seed architecture of the laser system 30 of FIG. 3 and heating the DFB laser diode 21 of the first seed stage by direct current injection, much faster pointing compensation should be possible, with time constants down to the millisecond regime.

The controller 37 generates the electrical current pulses 29 to drive the temperature of the DFB laser diode 21 by direct current injection, which changes the temperature much more quickly. Because the pulsed SOA 31 of seed second stage has a high contrast (on/off) ratio, for example 1000:1 or more, it can prevent significant radiation from the DFB laser diode 21 from propagating into the Yb fiber amplifier 28 and taking away power from the useful optical seed pulses 33. For this reason, the DFB laser diode 21 can be operated in a very flexible manner. One example of this operation would be to heat the DFB laser diode 21 using some form of pulsewidth modulation. To deliver the optical pulses 33 into the Yb fiber amplifier 28, the DFB laser diode 21 only needs to be lasing at high current during the time when the SOA 31 is pulsed with the electrical current pulses 32. For example, to achieve a 1 ns to 10 ns duration of the seed pulses 33 fed into the Yb fiber amplifier 28, the DFB laser diode 21 would typically be pulsed much more slowly, perhaps on the order of 50 ns pulsewidth. If rapid heating of the DFB laser diode 21 were desired, however, the pulsewidth could be increased dramatically without significantly adding to the undesired optical power injected into the Yb fiber amplifier 28.

Figure 4:
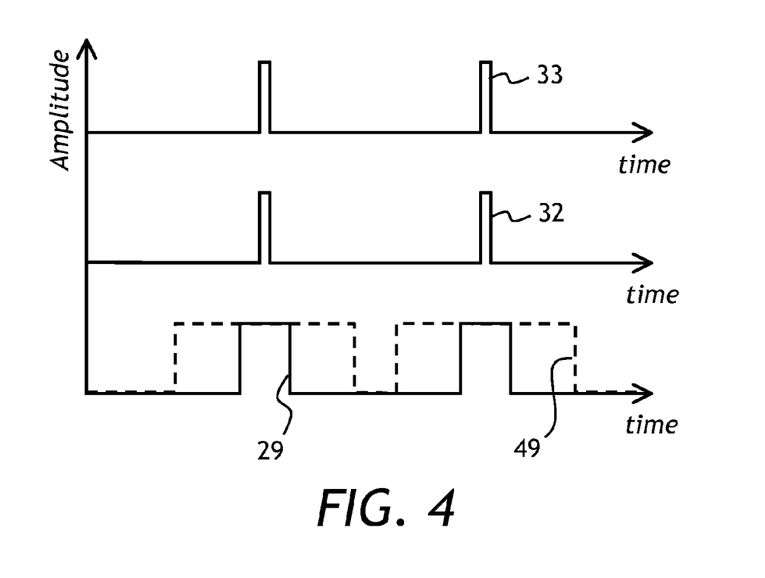
FIG. 4 is a time trace diagram illustrating operation of the laser system of FIG. 3.

Referring to FIG. 4 with further reference to FIG. 3, a pulsewidth modulation approach to heating the DFB laser diode 21 is illustrated by means of time trace diagrams. The SOA amplifier 31 is driven with the short electrical current pulses 32 to generate the desired pulsewidth of the second harmonic 24A and/or the third harmonic 24B output radiation, while the DFB laser diode 21 is driven with the somewhat longer electrical pulses 29 to insure spectrally stable operation at the moment the SOA 31 is pulsed. If a wavelength shift is desired, the duty cycle of the electrical pulses 29 can be varied from a low value, for example 0.1%, up to 100%. Extended electrical current pulses 49, shown in a dashed line, illustrate the condition where the DFB laser diode 21 needs to be rapidly heated to shift the wavelength. The controller 37 is configured to synchronize the SOA driver 27B and the laser diode driver 27A, to lessen or minimize a variation of a duration of the light pulses 33 as the duration of the electrical current pulses 29 is varied to tune the temperature.

Referring back to FIGS. 1 to 3, the purpose of the TEC 8 thermally coupled to the frequency converting element 13 (FIG. 1) and the second and third harmonic crystals 23A and 23B (FIGS. 2 and 3) will be explained. Normally, nonlinear optical crystals are temperature stabilized to ensure stable frequency converting operation. The TEC 8 can be used for that purpose. In practice, the wavelength range over which the seed laser 11 (FIG. 1) or the DFB laser diode (FIGS. 2 and 3) can be tuned may be limited, for example by wavelength-sensitive components within the laser system 20 or 30 of FIGS. 2 and 3, such as amplified spontaneous noise (ASE) reduction filters, not shown, or by the gain spectrum of the Yb amplifier 28, or by intrinsic limitations of the DFB laser diode 21 or the seed laser 11. For typical implementations, the usable operating wavelength range of the system 10 of FIG. 1 could be, for example, between 1 nm and 10 nm in width. As a result, it may occur that the angle α for optimal phase matching drifts so far that the system 10 is unable to tune the seed laser 10 far enough to recover the desired pointing angle. In this case a feedback control of the frequency converting element 13 temperature over a link 7 could be implemented in addition to the seed laser 11 wavelength control over the link 19. The frequency converting element 13 temperature control would be a slow feedback loop that would continually adjust the frequency converting element 13 temperature to ensure that the faster seed-laser 11 control 17 would remain biased near the center of its wavelength and thus remain able to respond quickly to any phase-matching drifts without hitting the limits of its range. To ensure this double-loop feedback control, the controller 17 can be configured for adjusting a temperature of the frequency converting element 13 by providing, over the link 7, a varying electric current to the TEC 8 of the frequency converting element 13, so as to lessen the deviation of the pointing angle α of the second optical beam 14. As explained above, the adjustment rate of the temperature of the frequency converting element 13 is preferably made slower than the adjustment rate of the first optical frequency of the seed laser 11. In this way, quick pointing changes can be handled via adjusting the first optical frequency of the seed laser 11, and more slow pointing changes can be handled via adjusting the temperature of the frequency converting element 13.

Figure 5:
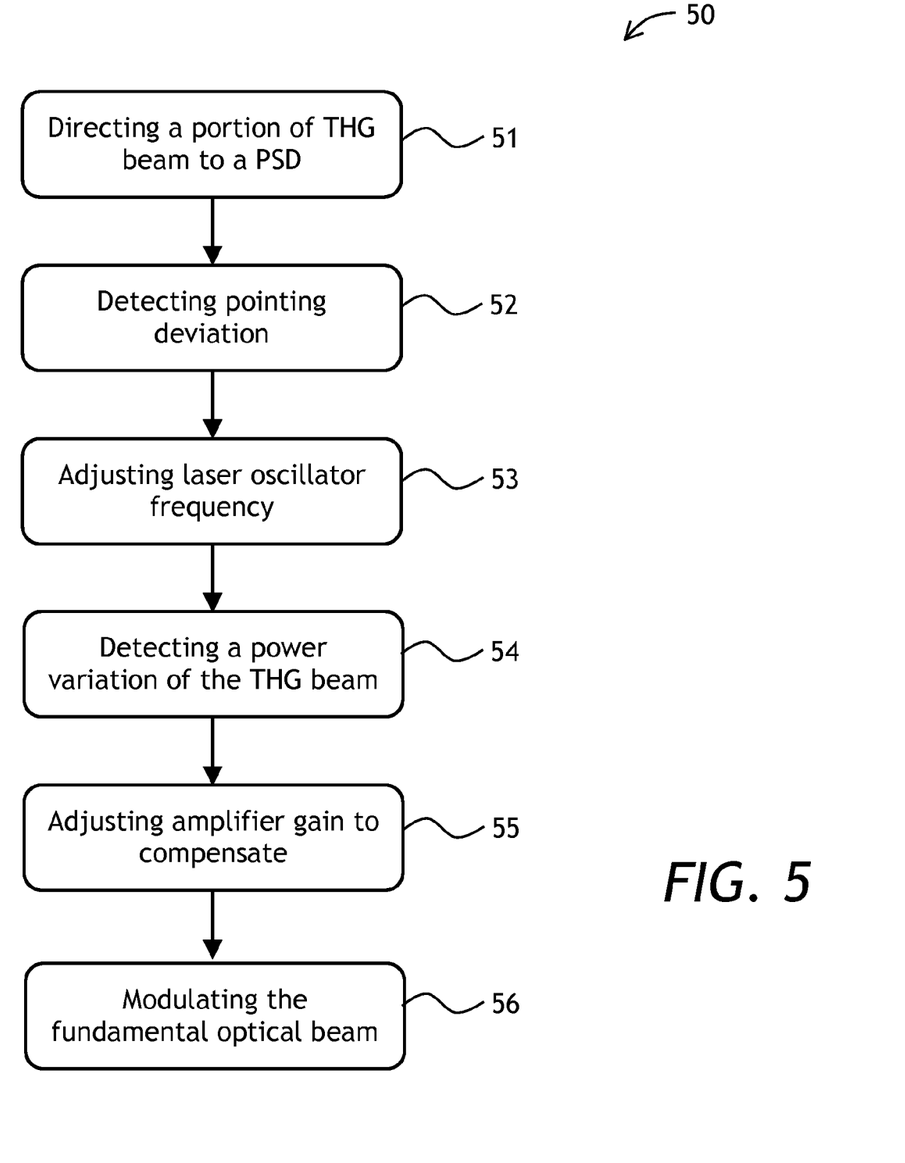
FIG. 5 is a flow chart of a method of the invention for lessening a drift of pointing angle of the laser systems of FIGS. 1 to 3.

Turning now to FIG. 5 with further reference to FIG. 1, a method 50 for lessening the deviation α of the pointing angle of the frequency-converting laser system 10 of FIG. 1 includes a step 51 of directing the portion 16' of the deviated second optical beam 14' to the position-sensitive detector 15; a step 52 of detecting the deviation α of the pointing angle of the second optical beam using the position-sensitive detector 15; and a step 53 of adjusting, via the controller 17, the first frequency of the laser oscillator 11, so as to lessen the deviation α of the pointing angle of the second optical beam 14'. Optionally, as explained in the previous paragraph, the temperature of the frequency converting element 13 can also be adjusted via the TEC 8 to improve the dynamic range of the pointing angle compensation.

Still referring to FIG. 5, with further reference now to FIG. 2 and the laser system 20, the method 50 further includes an optional step 54 of detecting a variation of optical power of the second optical beam, in this case the third harmonic beam 24B, due to adjusting the first frequency of the DFB laser diode 21 in the step 53, and an optional step 55 of adjusting gain of the Yb optical fiber amplifier 28, by adjusting the DC driving current 25A of the pump diode 25, so as to lessen the variation of the optical power of the third harmonic beam 24B detected in the step 54.

For the laser system 20 of FIG. 2 including the DFB laser diode 21, the step 53 can include adjusting a temperature of the DFB laser diode 21 to tune the first frequency. As explained above, the first frequency can be adjusted by applying a varying time-averaged electrical current to the DFB laser diode 21, thereby varying its temperature. The varying electrical current can include the electrical current pulses 29 of varying duration as explained above. Alternatively or in addition, a temperature of the TEC 9 of the DFB laser diode 21 can also be adjusted to tune the first frequency.

Still referring to FIG. 5, with further reference now to FIG. 3 and the laser system 30, the method 50 further includes an optional step 56 of operating the SOA 31 or another optical modulator means to modulate the first optical beam 12, in synchronism with applying the electrical current pulses 29 to the DFB laser diode 21, so as to lessen a variation of a duration of the light pulses 33 as the duration of the electrical current pulses 29 is varied.

The foregoing description of the embodiments of the invention has been presented for the purposes of illustration and description. It is not intended to be exhaustive, or to limit the invention to the precise form disclosed. Many modifications and variations are possible in light of the above teaching. For instance, the angle-to-offset lens 35 can be used not only in the laser system 30 of FIG. 3, but also in the laser systems 10 and 20 of FIGS. 1 and 2, respectively. Various types of pulsed amplifiers, known to the skilled person, can be used in place of the SOA amplifier 31; as well as various types of wavelength-tunable seed laser sources can be used in place of the DFB laser diode 21 of FIGS. 2 and 3 and/or the laser oscillator 11 of FIG. 1. The Yb fiber amplifier 28 can be replaced with a free space optical amplifier, a waveguide optical amplifier, etc., suitable for the wavelength range employed. The nonlinear optical frequency conversion can include SHG, THG, fourth and higher harmonic generation, and the like. Generally, it is intended that the scope of the invention be limited not by this detailed description, but rather by the claims appended hereto.

What is claimed is:

1. A laser system comprising:
    a laser oscillator for providing a first optical beam at a first optical frequency;
    a frequency converting element coupled to the laser oscillator, for converting the first optical beam into a second optical beam at a second optical frequency different from the first optical frequency, wherein a pointing angle of the second optical beam is dependent on the first optical frequency;
    a beamsplitter coupled to the frequency converting element, for splitting a portion of the second optical beam;
    a position-sensitive detector coupled to the beamsplitter, for receiving the portion of the second optical beam for detecting a deviation of the pointing angle of the second optical beam; and
    a controller coupled to the position-sensitive detector and to the laser oscillator, configured for adjusting, at a first adjustment rate, the first optical frequency of the laser oscillator, so as to lessen the deviation of the pointing angle of the second optical beam.

2. The laser system of claim 1, wherein the laser oscillator comprises a laser diode.

3. The laser system of claim 2, wherein the first frequency is tunable by adjusting a temperature of the laser diode.

4. The laser system of claim 3, further including a thermoelectric cooler thermally coupled to the laser diode, wherein the controller is configured to tune the first frequency by applying a varying electrical current to the thermoelectric cooler, for varying the temperature of the laser diode.

5. The laser system of claim 3, wherein the controller is configured to tune the first frequency by applying a varying electrical current to the laser diode, for varying the temperature thereof.

6. The laser system of claim 5, further comprising an optical modulator means coupled between the laser oscillator and the frequency-converting element, for modulating the first optical beam to generate a train of light pulses at the first frequency;
    wherein the controller includes an electrical pulse generator for applying electrical current pulses of varying duration to the laser diode, for varying the temperature thereof and tuning the first frequency via the temperature variation, and
    wherein the controller is configured to synchronize the optical modulator means and the electrical pulse generator, to lessen a variation of a duration of the light pulses as the duration of the electrical current pulses is varied.

7. The laser system of claim 6, wherein the optical modulator means comprises an electro-optical or acousto-optical modulator.

8. The laser system of claim 6, wherein the optical modulator means comprises a pulsed semiconductor optical amplifier coupled to the controller, for amplifying the light pulses at the first frequency.

9. The laser system of claim 8, further comprising an optical fiber amplifier coupled between the pulsed semiconductor optical amplifier and the frequency-converting element, for further amplifying the light pulses.

10. The laser system of claim 9, wherein the frequency converting element includes a nonlinear optical crystal for second or third optical harmonic generation, wherein the second optical frequency is twice or thrice the first optical frequency, respectively.

11. The laser system of claim 1, further comprising a thermoelectric cooler thermally coupled to the frequency converting element;
    wherein the controller is configured for adjusting, at a second adjustment rate, a temperature of the frequency converting element by providing a varying electric current to the thermoelectric cooler, so as to lessen the deviation of the pointing angle of the second optical beam,
    wherein the first adjustment rate is higher than the second adjustment rate.

12. The laser system of claim 1, wherein the frequency converting element includes a nonlinear optical crystal for second or third optical harmonic generation, wherein the second optical frequency is twice or thrice the first optical frequency, respectively, the laser system further comprising an optical fiber amplifier coupled between the laser oscillator and the frequency-converting element, for amplifying the first optical beam.

13. The laser system of claim 1, wherein the position-sensitive element comprises:
    a split photodiode, a quad-cell photodiode, a linear array detector, or a 2D array detector; and an angle-to-offset element selected from the group consisting of a lens and a concave minor.

14. A method for lessening a drift of a pointing angle of the laser system of claim 1, the method comprising:
    (a) directing the portion of the second optical beam to the position-sensitive detector;
    (b) detecting the deviation of the pointing angle of the second optical beam using the position-sensitive detector; and
    (c) adjusting, via the controller and at a first adjustment rate, the first optical frequency of the laser oscillator, so as to lessen the deviation of the pointing angle of the second optical beam.

15. The method of claim 14, wherein the laser system further comprises an optical amplifier coupled between the laser oscillator and the frequency-converting element, for amplifying the first optical beam, the method further comprising (d) detecting a variation of optical power of the second optical beam due to adjusting the first frequency of the laser oscillator in step (c); and (e) adjusting gain of the optical amplifier, so as to lessen the detected variation of the optical power of the second optical beam.

16. The method of claim 14, wherein the laser oscillator includes a laser diode, wherein step (c) includes adjusting a temperature of the laser diode to tune the first frequency.

17. The method of claim 16, wherein the laser system further comprises a thermoelectric cooler thermally coupled to the laser diode, wherein in step (c), the first frequency is adjusted by providing a varying electric current to the thermoelectric cooler, for varying the temperature of the laser diode.

18. The method of claim 16, wherein in step (c), the first frequency is adjusted by applying a varying electrical current to the laser diode, thereby varying the temperature thereof.

19. The method of claim 18, wherein in step (c), the temperature of the laser diode is adjusted by applying electrical current pulses of varying duration to the laser diode, thereby varying the temperature thereof and tuning the first frequency of the first optical beam as a result of the temperature variation, wherein the laser system further comprises an optical modulator means coupled between the laser oscillator and the frequency-converting element, for modulating the first optical beam to generate a train of light pulses at the first frequency, the method further comprising (i) operating the optical modulator means to modulate the first optical beam, in synchronism with applying the electrical current pulses to the laser diode, so as to lessen a variation of a duration of the light pulses as the duration of the electrical current pulses is varied.

20. The method of claim 14, wherein the laser system further comprises a thermoelectric cooler thermally coupled to the frequency converting element, the method further comprising (ii) adjusting, via the controller and at a second adjustment rate, a temperature of the frequency converting element, by providing a varying electric current to the thermoelectric cooler, so as to lessen the deviation of the pointing angle of the second optical beam, wherein the first adjustment rate is higher than the second adjustment rate.

* * * * *

UNITED STATES PATENT AND TRADEMARK OFFICE
CERTIFICATE OF CORRECTION

| | | |
|---|---|---|
| PATENT NO. | : 8,879,589 B2 | Page 1 of 1 |
| APPLICATION NO. | : 13/847405 | |
| DATED | : November 4, 2014 | |
| INVENTOR(S) | : Muendel et al. | |

It is certified that error appears in the above-identified patent and that said Letters Patent is hereby corrected as shown below:

In the Claims

Claim 13, column 10, line 51, "a concave minor" should read --a concave mirror--

Signed and Sealed this
First Day of September, 2015

Michelle K. Lee
*Director of the United States Patent and Trademark Office*